United States Patent [19]

Shimada et al.

[11] Patent Number: 4,856,011
[45] Date of Patent: Aug. 8, 1989

[54] SEMICONDUCTOR LASER CONTROL CIRCUIT

[75] Inventors: Kazuyuki Shimada, Tokyo; Isamu Shibata, Fuchu, both of Japan

[73] Assignee: Ricoh Company, Ltd., Tokyo, Japan

[21] Appl. No.: 270,474

[22] Filed: Nov. 8, 1988

Related U.S. Application Data

[63] Continuation of Ser. No. 102,247, Sep. 28, 1987, abandoned, which is a continuation of Ser. No. 820,947, Jan. 21, 1986.

[30] Foreign Application Priority Data

Jan. 30, 1985 [JP] Japan .................................. 60-16013
Jan. 30, 1985 [JP] Japan .......................... 60-11696[U]

[51] Int. Cl.$^4$ ......................... H01S 3/00; H01S 3/13; G01J 1/32
[52] U.S. Cl. ....................................... 372/38; 372/29; 372/31; 455/608; 455/613; 250/205; 315/149
[58] Field of Search ............................. 372/29, 31, 38; 455/608, 613; 250/205; 315/149

[56] References Cited

U.S. PATENT DOCUMENTS

| 3,648,073 | 3/1972 | Sams et al. | 372/38 |
| 3,810,097 | 5/1974 | Muir et al. | 455/608 |
| 3,879,687 | 4/1975 | Daehlin et al. | 455/608 |
| 4,158,151 | 6/1979 | Grundler | 372/38 |
| 4,558,465 | 12/1985 | Siegel et al. | 372/38 |
| 4,580,044 | 4/1986 | Hongo et al. | 372/31 |
| 4,584,719 | 4/1986 | Miller | 455/608 |
| 4,618,958 | 10/1986 | Shibata et al. | 372/29 |
| 4,689,795 | 8/1987 | Yoshimoto | 372/31 |

FOREIGN PATENT DOCUMENTS

| 24991 | 3/1981 | Japan | 372/38 |
| 99859 | 3/1981 | Japan | 455/608 |
| 3297 | 1/1983 | Japan | 372/38 |
| 149231 | 8/1985 | Japan | 455/613 |
| 169182 | 9/1985 | Japan | 372/38 |
| 2054949 | 2/1981 | United Kingdom | 372/38 |

OTHER PUBLICATIONS

Ostoich et al. Direct modulation of D. H. GaAlAs lasers with GaAs M.E.S.F.E.T.S Electronics Letters Oct. 16, 1975, vol. 11, No. 21, pp. 515–516.

Primary Examiner—Eugene R. Laroche
Assistant Examiner—Michael B. Shingleton
Attorney, Agent, or Firm—Cooper & Dunham

[57] ABSTRACT

A system for controlling the operation of a semiconductor laser is provided. In one aspect of the present invention, a switching element, which is turned on and off in accordance with a signal modulated with image information, is connected in series with the semiconductor laser for controlling the operation thereof. In another aspect of the present invention, a semiconductor laser control system includes a photodetector for detecting the intensity of a laser beam emitted from the laser, a comparator for comparing the detected intensity with a predetermined refence intensity, an up/down counter which changes its count depending on the result of the comparison at the comparator, and a laser driver which supplies a driving current to the laser as modified by the count of the counter. A reset circuit is provided to reset the counter when at least the laser driver is powered up with a predetermined supply voltage. In addition, the laser driver is so structured that the supply of the driving current to the laser is disconnected for a predetermined time period after the power up thereof.

6 Claims, 4 Drawing Sheets

SEMICONDUCTOR LASER CONTROL CIRCUIT

This is a continuation of application Ser. No. 102,247, filed 09-28-87, now abandoned, which is turn is a continuation of application Ser. No. 06/820,947 filed on Jan. 21, 1986.

BACKGROUND OF THE INVENTION

1. Field of the Invention

This invention relates to a system for controlling the operation of a semiconductor laser, and, in particular, to a system for controlling the operation for turning on or turning off of a semiconductor laser. More specifically, the present invention relates to a system for controlling the operation of a semiconductor laser for use in a light scanning system, such as a laser printer, as a source for emitting a laser beam.

2. Description of the Prior Art

A semiconductor laser is being widely used as a source for emitting a laser beam, for example, in a light scanning system, such as a laser printer. When used as a beam source in a laser printer, a modulation signal carrying image information must be supplied for driving a semiconductor laser which then emits a modulated laser beam carrying image information. Such a modulated laser beam is then passed through an optical system including a rotating beam deflector, such as a polygonal mirror, and focusing means, such as fθ lens, to be focused onto an imaging surface, such as a photosensitive surface, in a scanned fashion, so that an electrostatic latent image is formed on the imaging surface in accordance with the image information.

A typical prior art semiconductor laser modulation system is shown in FIG. 1, and it includes a constant current source comprised of a constant voltage source 1, a PNP transistor 2, and a resistor 3, which supplies a constant current to a semiconductor laser 11 through a differential switching circuit comprised of a pair of PNP transistors 4 and 5 and resistors 6 through 10. In this system, an image-modulated signal is applied to an input terminal 12, and the differential amplifier controls the on/off operation of the semiconductor laser 11 in accordance with the image-modulated signal. Such a prior art system for controlling the operation of the semiconductor laser calls for the provision of a differential amplifier and thus it is rather complicated in structure and expensive to manufacture.

On the other hand, it is known in the art that the semiconductor laser is very sensitive to the surrounding temperature, and the intensity of the laser output fluctuates significantly depending on the temperature of the surrounding atmosphere. Thus, it is often required to provide means for stabilizing the laser output in the semiconductor laser operating system. One known viable technique for stabilizing the output of a semiconductor laser is to use a counter for controlling the laser power output in a feedback loop. In this prior art system, the feedback loop includes a monitoring photodetector for detecting the current intensity of the laser beam emitted from a semiconductor laser and its detected intensity is compared with a predetermined reference level, whereby the count of the counter is updated so as to make the difference between the detected and reference values zero and the updated count is used to suitable vary the level of driver current to be supplied to the semiconductor laser. In such a prior art semiconductor laser controlling system, there is a danger that an undesirably large driving current could be supplied to the semiconductor laser, thereby destroying the laser or causing the laser to malfunction, and, thus, there is a need to provide some kind of a safety feature so as to avoid such an undesired situation to happen.

SUMMARY OF THE INVENTION

It is therefore a primary object of the present invention to obviate the disadvantages of the prior art as described above and to provide an improved system for controlling the operation of a semiconductor laser.

Another object of the present invention is to provide an improved system for controlling the on/off operation of a semiconductor laser.

A further object of the present invention is to provide an improved semiconductor laser operating system suitable for use in a light scanning system, such as a laser printer.

A still further object of the present invention is to provide an improved semiconductor laser operating system simple in structure, easy to manufacture and low at cost.

A still further object of the present invention is to provide an improved semiconductor laser operating system excellent in controlling the supply of driving current to the semiconductor laser.

Other objects, advantages and novel features of the present invention will become apparent from the following detailed description of the invention when considered in conjunction with the accompanying drawings.

DESCRIPTION OF THE PREFERRED EMBODIMENTS

In accordance with a first aspect of the present invention, there is provided a semiconductor laser operating system including switching means connected in parallel with a semiconductor laser, whereby the switching means includes an input terminal for receiving an input signal modulated with image information so that the switching means causes the semiconductor laser to turn on and off in accordance with the input signal supplied thereto. This aspect of the present invention will be described with particular reference to FIGS. 2 and 3.

Figure 1:
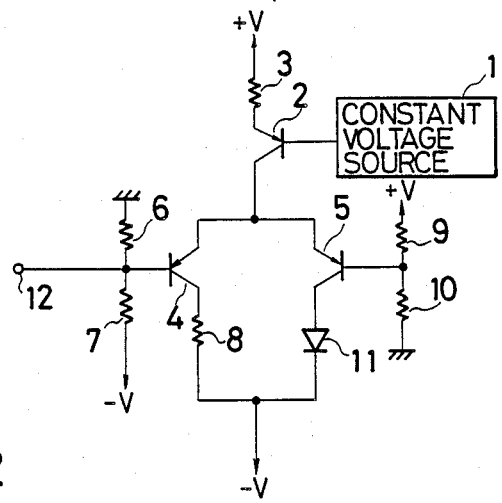
FIG. 1 is a circuit diagram showing a prior art semiconductor laser driving system using a differential amplifier for controlling the operation of a semiconductor laser in accordance with an input signal modulated with image information.
Figure 2:
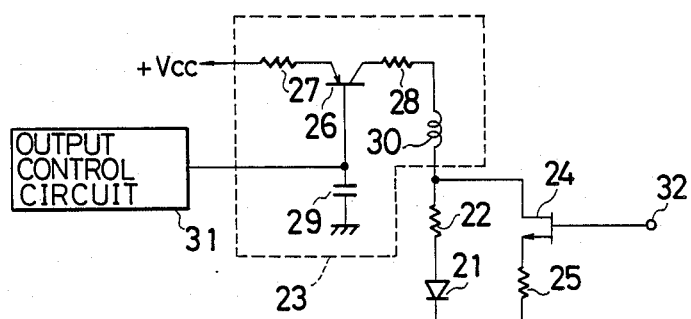
FIG. 2 is a circuit diagram showing a semiconductor laser operating system for controlling the operation of a semiconductor laser in accordance with an image-modulated input signal constructed in accordance with one embodiment of the present invention.

FIG. 2 shows a system for controlling the operation of a semiconductor laser which is constructed in accordance with one embodiment of the present invention and which uses a FET transistor as the switching means for controlling the operating state of the semiconductor laser. As shown, a semiconductor laser 21 is provided with its cathode connected to ground and its anode connected to an output terminal of a constant current source 23 through a resistor 22. Also provided as connected in parallel with the semiconductor laser 21 is a FET transistor 24 which has it drain connected to a junction between the output of the constant current source 23 and the anode of the semiconductor laser 21, its source connected to ground through a resistor 25, and its gate connected to an input terminal 32 to which an input signal modulated with image information is applied.

The constant current source 23 includes a PNP transistor 26 having its emitter connected to a supply voltage $+V_{cc}$ through a resistor 27, its collector connected to the output terminal of the constant current source 23 through a series connection of a resistor 28 and a coil 30, and its base connected to an output control circuit 31 and also to one plate of a capacitor 29 whose the other plate is connected to ground. As is obvious, the level of constant current to be supplied by the constant current source 23 is set by an output voltage supplied from the output control circuit 31.

In operation, the switching transistor 24 is turned on and off depending on the input signal modulated with image information applied to the input terminal 32. And, thus, since the semiconductor laser 21 is connected in parallel with the switching transistor 24, the semiconductor laser 21 is also turned on and off depending on the on/off condition of the switching transistor 24. That is, when the switching transistor 24 turns off, the constant current source 23 supplied its constant driving current to the semiconductor laser 21 so that the laser 21 is turned on to emit a laser beam; on the other hand, when the switching transistor 24 turns on, the semiconductor laser 21 is short-circuited through the resistors 22 and 25 so that the laser 21 is turned off to terminate the emission of a laser beam.

Figure 3:
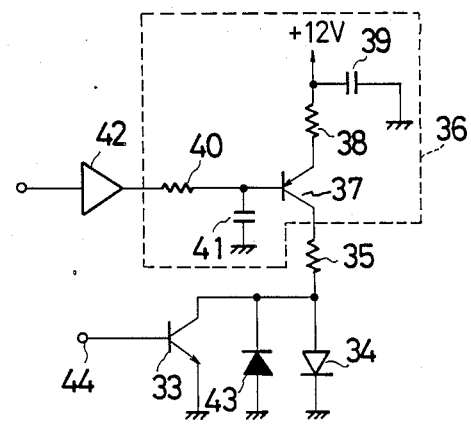
FIG. 3 is a circuit diagram showing a semiconductor laser operation system for controlling the operation of a semiconductor laser constructed in accordance with another embodiment of the present invention.

FIG. 3 shows another embodiment of the present invention, in which case use is made of an open collector NPN transistor as the switching means for controlling the on/off condition of a semiconductor laser. As shown, a semiconductor laser 34 has it cathode connected to ground and its anode connected to an output terminal of a constant current source 36 through a resistor 35. The constant current source 36 includes a PNP transistor 37 which has its emitter connected to a supply voltage +12V through a resistor 38, its collector connected to the output terminal of the constant current source 36, and its base connected to an output control terminal through a series connection of an amplifier 42 and a resistor 40. An appropriate control voltage is applied to the output control terminal so that the constant current source 36 supplies constant current at its output terminal in accordance with such a control voltage. Also provided in the constant current source 36 are a capacitor 39 having one plate connected to a junction between the resistor 38 and the supply voltage +12V and its other plate connected to ground and another capacitor 41 having one plate connected to a junction between the PNP transistor 37 and the resistor 40 and its other end connected to ground.

An NPN transistor 33 is provided with its collector being connected to a junction between the resistor and the semiconductor laser 34, its emitter connected to ground, and its base connected to an input termal 44 to which an input signal modulated with image information is applied. Also provided is a protection diode 43 which is connected in parallel with the semiconductor laser 34 in the reversed direction.

With this structure shown in FIG. 3, when the switching transistor 33 turns off in accordance with the modulation signal supplied to the input terminal 44, the constant current source 36 supplies its driving current to the semiconductor laser 34 so that the laser 34 is turned on to emit a laser beam. On the other hand, when the switching transistor 33 turns on in accordance with the modulation signal, then the semiconductor transistor 34 is short-circuited by the switching transistor 33 so that the semiconductor laser 34 is turned off, thereby terminating to emit a laser beam.

It is to be noted that, as an alternative structure, the NPN switching transistor 33 may be replaced by a transistor-transistor-logic (TTL) of the open collector type.

Now, another aspect of the present invention will be described below. This aspect of the present invention is concerned with provision of a safety feature in a semiconductor laser controlling system using a counter for variably setting the level of driving current to be supplied to the semiconductor laser so as to maintain the intensity of a laser beam emitted from the semiconductor laser.

First, the overall structure of a laser printer in which a semiconductor laser is used as a laser beam source will be described with reference to FIG. 4. As shown, the laser printer includes a semiconductor laser 51 emitting a laser beam which passes through a collimating lens 52 to be collimated. And, the collimated laser beam then impinges upon a rotating polygonal mirror 53 to be deflected over a predetermined angle, and the thus deflected laser beam then passes through a focusing lens 54, or fθ lens in the illustrated example, to be focused onto an imaging surface 55, or a peripheral surface of a photosensitive drum in the illustrated embodiment. As the polygonal mirror 53 rotates over a predetermined angle, the laser beam deflected by the polygonal mirror 53 scans along an imaginary scanning line in the direction indicated by X across the photosensitive drum 55. It is to be noted that the scanning direction X is often referred to as the main scanning direction. Since the polygonal mirror 53 is provided with a plurality of mirror surfaces arranged along its circumference, as the polygonal mirror 53 rotates clockwise as indicated by the arrow as driven by a motor (not shown), the deflected laser beam scans across the drum 55 in the main scanning direction X repetitively. Although not shown specifically, it should be understood as well known for one skilled in the art that the photosensitive drum 55 is driven to rotate in a predetermined direction at constant speed, which is often referred to as the auxiliary scanning direction, and various image forming units are disposed around the drum 55 and such units typically include charging means, developing means, and transferring means. Thus, the photosensitive drum 55 is uniformly charged to a predetermined polarity before being scanned by the laser beam deflected from the polygonal mirror 53. As will be described in detail later, the laser beam is modulated with image information so that the uniform charge on the drum 55 is selectively dissipated when scanned by the laser beam. In this manner, an electrostatic latent image is formed on the peripheral surface of the drum 55 and it is developed and then transferred to a sheet of transfer paper.

Figure 4:
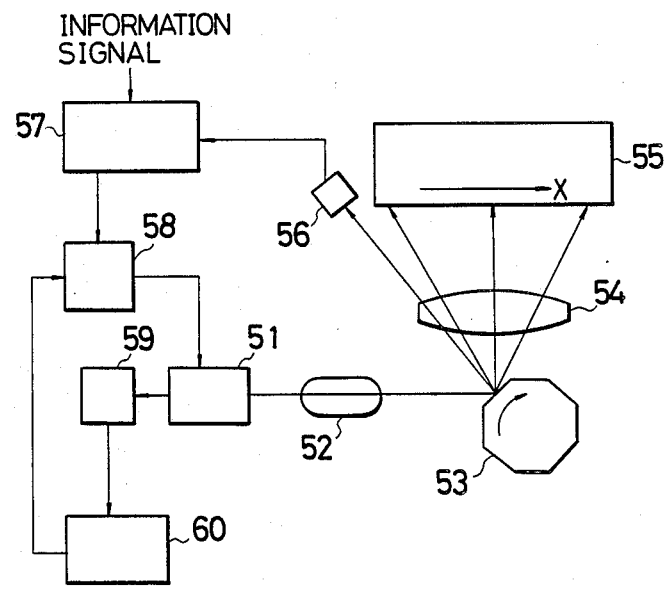
FIG. 4 is a block diagram showing the overall structure of a laser printer to which the present invention may be advantageously applied.

Also provided in the laser printer shown in FIG. 4 is a synchronizing photodetector 56 which is disposed at a location outside of the scanning angle across the photosensitive drum 55 and yet capable of receiving the laser beam deflected by the polygonal mirror 55 and passed through the f$\theta$ lens 54. The photodetector 56 receives the laser beam at the time prior to the initiation of scanning across the photosensitive drum 55 and a detection signal supplied from the photodetector is used for synchronizing the scanning operation. The detection signal supplied from the synchronizing photodetector 56 is supplied to a signal processing circuit 57 which also receives an information signal carrying image information and supplies it as a modulation signal to a semiconductor laser driver 58 in controlled timing according to the detection signal from the synchronizing photodetector 56. In response to the modulation signal thus supplied from the signal processing circuit 57, the semiconductor laser driver 58 drives the semiconductor laser 51 which thus emits the laser beam modulated with information signal and thus carrying image information to be recorded.

It is to be noted that the semiconductor laser 51 also emits a laser beam rearwardly and this rearwardly emitted laser beam is received by a stabilizing photodetector 59 which supplies a detection signal indicating the intensity of the laser beam to a control circuit 60, which, in turn, supplies a control signal to the semiconductor laser driver 58 in accordance with the detection signal from the stabilizing photodetector 59, so that the control signal suitably changes the level of driving current to be supplied to the laser 51, thereby maintaining the intensity of the laser beam emitted from the laser 51 to be substantially at constant.

Figure 5:
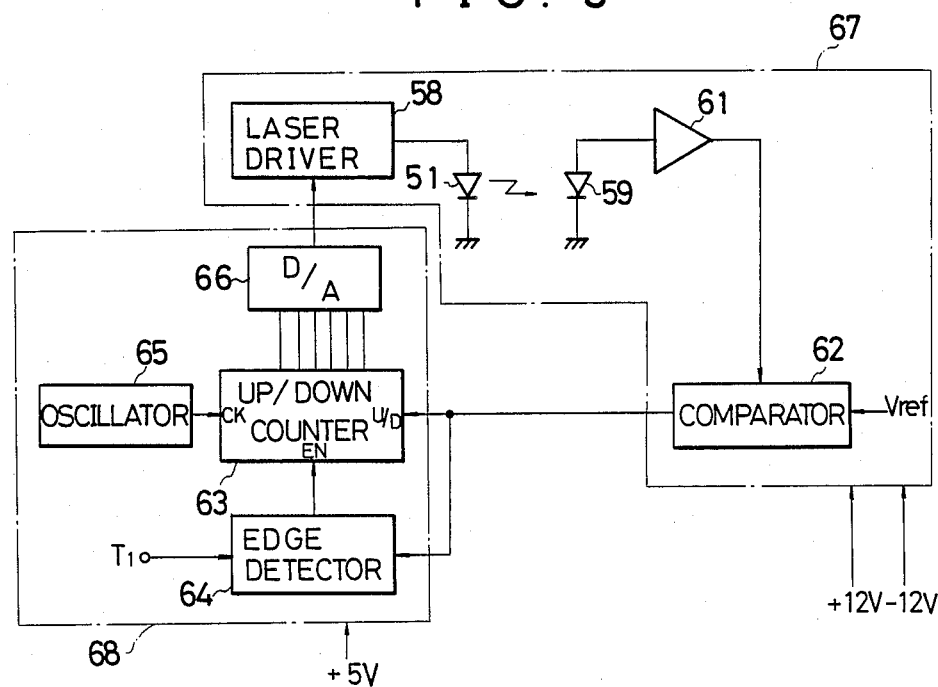
FIG. 5 is block diagram showing the detailed structure of part of the laser printer shown in FIG. 4.

FIG. 5 shows more in detail the structure of the semiconductor laser driver 58 and the control circuit provided in the laser printer shown in FIG. 4. As shown, the laser beam emitted from the semiconductor laser 51 in the rearward direction is received by the photodetector 59 comprised of a photodiode, which then supplies as its output current whose magnitude is proportional to the intensity of the laser beam. This current is then converted into a voltage by an amplifier 1, which is then supplied to a comparator 62 where the voltage is compared with a reference voltage $V_{ref}$. The comparator 62 supplies an output signal which has either a high or a low level depending on the difference between the detected and reference voltages and which is supplied to an up/down counter 63 to control its mode of operation. For example, if the intensity of the laser beam emitted from the semiconductor laser 51 is lower than a reference value, the output signal of the comparator 62 becomes the low level so that the up/down counter 63 is so set to operate as an up counter. Thus, when a timing signal $T_1$ is supplied to an edge detector 64 which thus allows the up/down counter 63 to be released out of the disabled state, the up/down counter 63 starts to increase its count in accordance with the clock signal supplied from an oscillator 65. The count of this up/down counter 63 is converted into an equivalent analog data by a D/A converter 66, which is then supplied to the semiconductor laser driving circuit 58.

As briefly described previously, in accordance with a modulation signal carrying image information supplied from the signal processing circuit 57, the semiconductor laser driver supplies driving current to the semiconductor laser 51. And, in this instance, the analog data supplied from the D/A converter 66 is amplified by an amplifier (not shown) and this amplified analog data is used to vary the level of the driving current to be supplied to the semiconductor laser 51. Accordingly, as the count of the up/down counter 63 gradually increases, the intensity of the laser beam emitted from the semiconductor laser 51 gradually increases so that the detection voltage obtained by the amplifier 61 increases. As a result, when the output signal of the comparator 62 changes from the low level to the high level, the edge detector 64 detects the rising edge in the output signal of the comparator 62, thereby causing the up/down counter 63 to be disabled. Thus, the up/down counter 63 holds the current count so that the magnitude of the driving current to be supplied to the semiconductor laser 51 is held at the current level.

On the other hand, if the output signal of the comparator 62 is at the high level (because the intensity of the laser beam is too high) at the time when the edge detector 64 has released the disabled state from the up/down counter 63 in accordance with the timing signal $T_1$, then the up/down counter 63 functions as a down counter, thereby decreasing its count in accordance with the clock signal supplied from the oscillator 65. As a result, the level of the analog data output from the D/A converter 66 decreases so that the level of the driving current to be supplied to the semiconductor laser 51 is reduced, which causes the voltage obtained at the amplifier 61 to become smaller. And, when the output voltage of the amplifier 61 has eventually become smaller than the reference voltage Vref, the output signal of the comparator 62 changes from the low level to the high level so that the edge detector 64 now detects the rising edge of the output signal of the comparator 62 thereby setting the up/down counter 63 in the disabled state. Accordingly, the up/down counter 63 holds the current count, and thus the magnitude of the driving current to be supplied to the semiconductor laser 51 is maintained at the current level.

The arrangement is such that the edge detector 64 sets the up/down counter 63 in the disabled state only when the output signal of the comparator 62 changes from the low level to the high level after the disabled state of the up/down counter 63 is released by the timing signal $T_1$. When the output signal of the comparator 62 has been changed from the low level to the high level while the disabled state is released from the up/down counter 63 by the timing signal $T_1$, the up/down counter 63 is set in the disabled state to thereby hold the current count. When the output signal of the comparator 62 changes from the high level to the low level under the conditions that the output signal of the comparator 62 is at the high level and the disabled state is released from the up/down counter 63 by the timing signal T₁, the up/down counter 63 remains to be released from the disabled state and serves as an up counter in accordance with the output signal of the comparator 62. Then, when the driving current supplied to the semiconductor laser 51 increases in level and thus the output signal of the comparator 62 changes from the low level to the high level, the edge detector 64 detects its falling edge to cause the up/down counter 63 to be disabled, thereby having the up/down counter 63 hold the current count.

It is to be noted that a first circuit section including the laser driver 58, amplifier 61 and comparator 62 as indicated by the one-dotted line is supplied with ±12 V from a first d.c. power supply (not shown); whereas, a second circuit section including the up/down counter 63, edge detector 64, oscillator 65 and D/A converter 66 as also indicated by the one-dotted line is supplied with ±5 V from a second d.c. power supply (not shown). It should also be noted that, in general, the rate of change of the surrounding temperature is relatively small in a laser printer in which a semiconductor laser is used, so that the fluctuations in the intensity of the laser beam can be neglected in a short period of time mainly through the thermal capacity effect of the semiconductor laser and its mounting structure. For this reason, as the timing signal $T_1$, use may be made of a print start signal, which is produced each time at the initiation of laser printing operation, or a power on reset signal, which is produced at the time of power up. Besides, safety measure must be taken in the laser printer to keep the laser beam from accidentally impinging upon a human eye. For this reason, typically an interlock switch is provided in the laser printer, and this interlock switch is operated automatically to shut off the first power supply when a top cover of the laser printer is pivotted open.

However, in the laser printer having the structure described above with reference to FIG. 5, if the first power supply for supplying the d.c. voltage of ±12 v is shut off by the interlock switch, the up/down counter 63 continuously increases its count since the output signal of the comparator 62 remains at the low level unless the up/down counter 63 is in the disabled state. And, thus, when the interlock switch is turned on later to turn on the first power supply for supplying the d.c. supply voltage of ±12 V, a substantially large driving current would be supplied to the semiconductor laser 51 which could damage or destroy the laser 51. Moreover, the amplifier (not shown) provided in the semiconductor laser driver 58 supplies a large transient output signal irrespective of the output of the D/A converter 66 immediately after power up, so that the laser drive 58 supplies a significantly large driving current to the semiconductor laser 51, which is also disadvantageous.

Figure 6:
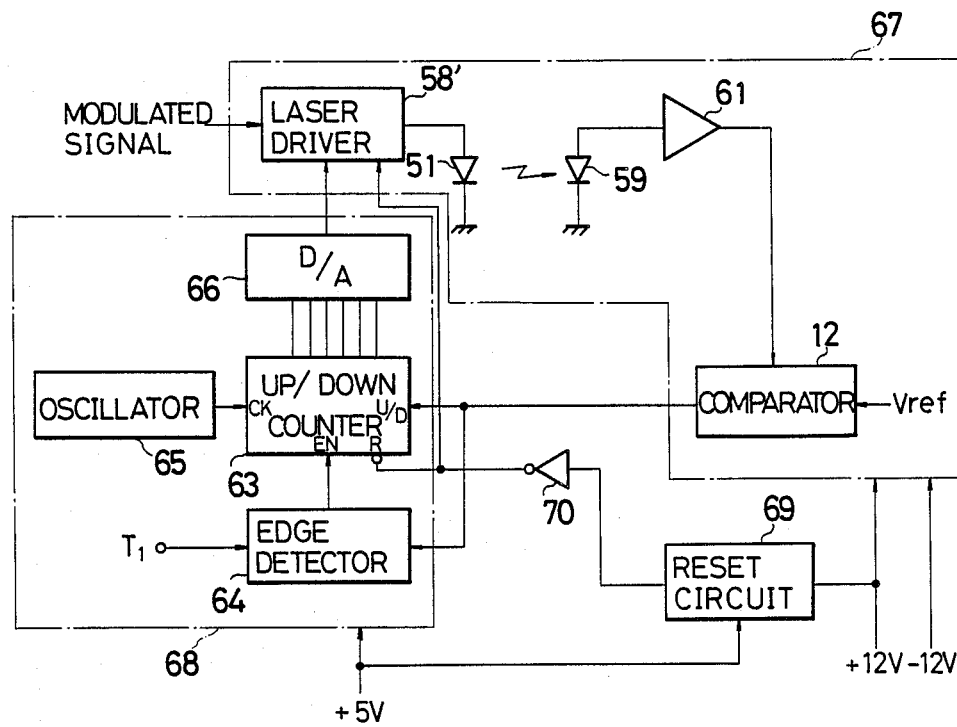
FIG. 6 is a block diagram showing a system for controlling the operation of a semiconductor laser which may be advantageously used in the laser printer shown in FIG. 5 and which is constructed in accordance with a further embodiment of the present invention.

FIG. 6 shows a semiconductor laser operating system constructed in accordance with a further embodiment of the present invention and which may be advantageously incorporated into a light scanning system, such as the laser printer described above and shown in FIG. 4. The structure shown in FIG. 6 is similar to that of FIG. 5 in many respects and thus like elements are indicated by like numerals thereby avoiding repetition of description. In the structure shown in FIG. 6, there is provided a reset circuit 69 which is connected to the first and second power supplies and also to a reset terminal of the up/down counter 63 through an inverter 70. The output terminal of the inverter 70 is also connected to the laser driver 58'.

With this structure, when the d.c. voltage of ±12 V is supplied, the reset circuit 69 supplies a reset signal which is supplied to the up/down counter 63 through the inverter 70 and also to the laser driver 58'. Thus, the up/down counter 63 is reset and at the same time the supply of driving current to the semiconductor laser 51 is disconnected. Accordingly, even if the d.c. power supply voltage of ±12 V is disconnected by the interlock switch and thus the count of the up/down counter 63 increases, when the interlock switch is restored to supply the voltage of ±12 V, the up/down counter 63 is reset so that there is no danger of supplying an undesirably large driving current to the semiconductor laser 51. In addition, immediately after power up, the laser driver 58' shuts off the driving current to the semiconductor laser 51 so that there is also no danger that the semiconductor laser 51 is damaged by a transient signal, which could be very large in magnitude.

Figure 7:
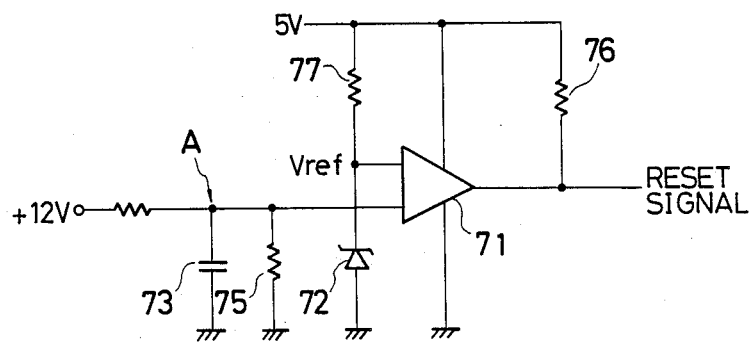
FIG. 7 is a circuit diagram showing the detailed structure of the reset circuit 69 provided in the system shown in FIG. 6.
Figure 8:
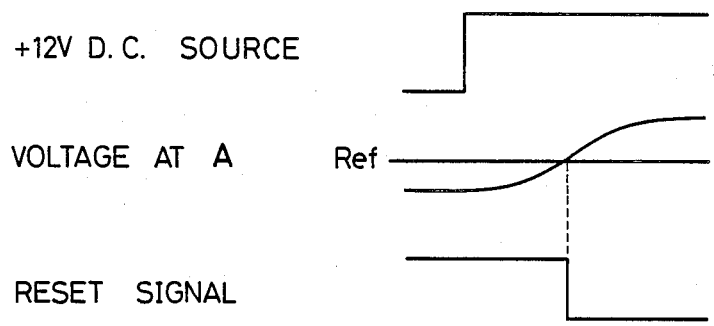
FIG. 8 is a timing chart which is useful for explaining the operation of the reset circuit 69 shown in FIG. 7.

FIG. 7 shows the detailed structure of the reset circuit 69 shown in FIG. 6 and FIG. 8 is a timing chart useful for understanding the operation of the reset circuit 69. As shown in FIG. 7, the reset circuit 69 includes a comparator 71 comprised of an operational amplifier, which has its first input terminal connected to a junction between a resistor 77 and a Zener diode 72, its second input terminal connected to the first power supply +12 v through a resistor, and its output connected to the second power supply of 5V through a resistor 76. The other end of the resistor 77 is connected to the second power supply and the Zener diode 72 has it anode connected to ground. The junction between the resistor 77 and the Zener diode 72 provides a reference voltage $V_{ref}$. Also provided are a resistor 75 and a capacitor 73 which are connected in parallel between the second input terminal of the comparator 71 and ground.

With this structure, when the d.c. voltage of +12V is supplied, its voltage of 12V is integrated by the resistor 75 and the capacitor 73, and the comparator 71 is not off and thus continues to output the reset signal until this integrated voltage reaches the reference voltage $V_{ref}$ in a range between 2 and 3 V which is determined by the Zener diode 72.

Figure 9:
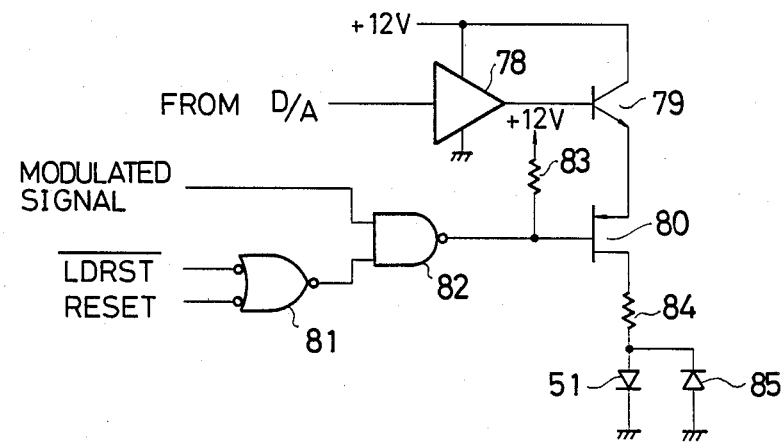
FIG. 9 is a circuit diagram partly in logic symbols showing the structure of the semiconductor laser driving circuit provided in the system shown in FIG. 6.

FIG. 9 shows the detailed structure of the laser driver 58' shown in FIG. 6. As shown, the analog output of the D/A converter 66 is amplified by an amplifier 78 and thus an NPN transistor 79 supplies current to the semiconductor laser 51 through a FET transistor 80 according to the level of the output voltage amplified by the amplifier 78. When an AND gate 81 receives the reset signal from the inverter 70 and at the same time a signal $\overline{LDRST}$, which is produced, for example, when the top cover of the laser printer is opened, the AND gate 81 supplies a high level output. The modulation signal from the signal processing circuit 57 is inverted by a NAND gate 82 and its inverted signal is supplied to the gate of the FET transistor 80 so that the FET transistor 80 is turned on by the modulation signal to activate the semiconductor laser 51, thereby causing it to emit a laser beam. Immediately after the supply of the d.c. supply voltage of ±12 V, the reset signal from the reset circuit 69 is at the high level and thus the output of the inverter 70 is at the low level, so that the output of the AND gate 81 becomes low level and the output of the NAND gate 82 becomes high level. As a result, the FET transistor 80 is turned off so that the supply of the driving current to the semiconductor laser 51 is terminated. Although the amplifier 78 supplies a large output in a transient period immediately after power up, since the supply of driving current to the semiconductor laser 51 is disconnected in this transient time period, such a large output is prevented from being supplied to the semiconductor laser 51. The reset circuit 69 is so structured that the reset signal is changed to its low level only when the output of the amplifier 78 has decreased to a level where the semiconductor laser 51 would not be destroyed even if the FET transistor 80 is turned on after the transient time period. Similarly, when the signal $\overline{\text{LDRST}}$ becomes low level, for example, by opening of the top cover of the laser printer and thus the output of the AND gate 81 becomes low level, the supply of the driving current to the semiconductor laser 51 is also disconnected. It is to be noted that 83 and 83 are resistors and 85 indicates a protection diode.

The above-described embodiment may be so modified that the up/down counter 63 functions as a down counter if the output signal of the comparator 62 is at the low level and as an up counter if the output signal of the comparator 62 is at the high level, whereby the driving current of the semiconductor laser 51 is in inversely proportional to the count of the up/down counter 63.

While the above provides a full an complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A system for controlling the operation of a semiconductor laser, comprising:

a semiconductor laser emitting a laser beam when driven with a driving current;

detecting means for detecting the intensity level of said laser beam emitted from said semiconductor laser;

comparing means for comparing said detected intensity level with a predetermined reference level and supplying an output signal which has either a first or a second state depending on a result of the comparison between the detected and reference levels;

a clock signal generating source supplying clock pulses;

counting means for counting clock signals supplied from said clock signal generating source, said counting means changing a count incrementally or decrementally depending on the state of said output signal from said comparing means;

driving means for driving said semiconductor laser with a driving current whose magnitude is varied depending on said count of said counting means;

resetting means for resetting said counting means when at least said driving means is powered up;

a power supply which powers said driving means with a first power supply voltage and powers said counting means with a second power supply voltage, wherein said first and second power supply voltages are different; and disconnecting means for disconnecting the supply of said driving current to said semiconductor laser for a predetermined period of time after power up of the driving means with said first power supply voltage in response to a reset signal supplied from said resetting means.

2. The system of claim 1 wherein said detecting means includes a photodetector for receiving said laser beam emitted from said semiconductor laser.

3. The system of claim 2 wherein said counting means includes an up/down counter which functions either as an up counter or as a down counter selectively in accordance with the state of said output signal supplied from said comparing means.

4. The system of claim 1 further comprising a D/A converter interposed between said counting means and said driving means to convert said count into an equivalent analog data signal which is then supplied to said driving means.

5. The system of claim 3 further comprising mode control means for controlling the operational mode of said up/down counter, said mode control means including a first input terminal for receiving a mode control signal supplied externally and further including a second input terminal connected to receive said output signal of said comparing means.

6. The system of claim 5 wherein said mode control means includes means for causing said up/down counter to be enabled and disabled selectively in accordance with said mode control signal and said output signal of said comparing means, and wherein said mode control means further includes and edge detector for detecting a leading or trailing edge of said output signal of said comparing means and means for controlling the mode of said up/down counter in accordance therewith.

* * * * *